(12) United States Patent
Lai et al.

(10) Patent No.: US 11,519,092 B1
(45) Date of Patent: Dec. 6, 2022

(54) SURFACE-TREATED COPPER FOIL AND COPPER CLAD LAMINATE

(71) Applicant: CHANG CHUN PETROCHEMICAL CO., LTD., Taipei (TW)

(72) Inventors: Ting-Chun Lai, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 17/562,031

(22) Filed: Dec. 27, 2021

(30) Foreign Application Priority Data

Jul. 19, 2021 (TW) .................................. 110126405

(51) Int. Cl.
*C25D 5/00* (2006.01)
*C25D 5/12* (2006.01)
*H05K 1/09* (2006.01)

(52) U.S. Cl.
CPC .............. *C25D 5/605* (2020.08); *C25D 5/12* (2013.01); *H05K 1/09* (2013.01); *Y10T 428/12438* (2015.01)

(58) Field of Classification Search
None
See application file for complete search history.

(56) References Cited

U.S. PATENT DOCUMENTS

| | | |
|---|---|---|
| 10,781,523 B1 | 9/2020 | Huang |
| 2006/0159949 A1 | 7/2006 | Yoo |
| 2018/0228029 A1 | 8/2018 | Moriyama |
| 2019/0330754 A1 * | 10/2019 | Lee .......................... C25D 3/38 |
| 2022/0089396 A1 * | 3/2022 | Yang ...................... B65D 21/00 |

FOREIGN PATENT DOCUMENTS

| | | | |
|---|---|---|---|
| KR | 10-2018-0091759 A | 8/2018 | |
| KR | 10-2019-0139883 A | 12/2019 | |
| KR | 10-2219847 B1 | 2/2021 | |
| TW | 201825717 A | 7/2018 | |
| WO | WO-2020105289 A1 * | 5/2020 | ............... C25D 5/10 |
| WO | WO-2021193246 A1 * | 9/2021 | |

OTHER PUBLICATIONS

M. Spilka et al., The Influence of Thickness and Number of Layers on Selected Properties of Cu/Ni Systems, Acta Physica Polonica A, vol. 135(2019), No. 2, DOI:10.12693/APhysPolA.135.172, 2018, pp. 172-176.

* cited by examiner

*Primary Examiner* — Seth Dumbris
(74) *Attorney, Agent, or Firm* — Winston Hsu

(57) ABSTRACT

A surface-treated copper foil includes a treating surface, and a peak extreme height (Sxp) of the treating surface being in a range of 0.4-2.5 μm, where the hysteresis loop of the surface-treated copper foil includes a first magnetization and a second magnetization when the magnetic field strength of the hysteresis loop is zero, and the absolute difference between the value of the first magnetization and the value of the second magnetization is in a range of 20-1200 emu/m³.

12 Claims, 3 Drawing Sheets

SURFACE-TREATED COPPER FOIL AND COPPER CLAD LAMINATE

BACKGROUND OF THE INVENTION

1. Field of the Invention

The present disclosure relates to the field of copper foil, in particular to a surface-treated copper foil and a copper-clad laminate thereof.

2. Description of the Prior Art

With increasing demand for small-sized and thin electronic products capable of transmitting high-frequency signals, the demand for copper foils and copper-clad laminates is also increasing. Generally, the circuit of a copper-clad laminate is carried by the insulating board, and the electrical signals may be transmitted to a predetermined region along a predetermined path within the layout of the circuits. In addition, for the copper-clad laminate used for transmitting high-frequency electrical signals (for example, higher than 10 GHz), the circuit of the copper-clad laminate must be further optimized to reduce the transmission loss of signal caused by a skin effect. The so-called skin effect means that with the increase in the frequency of the electrical signal, the transmission path of the current will be more concentrated on the surface of the conductive line, especially on the surface of the conductive line close to the board. In order to reduce the transmission loss of signal caused by skin effect, the conventional technique is to flatten the surface of the conductive line in the copper-clad laminate close to the board as much as possible. However, even if the aforementioned technique may effectively reduce the transmission loss of signal caused by the copper-clad laminate, there are still technical drawbacks to be overcome.

Therefore, there is still a need to provide a surface-treated copper foil and copper-clad laminate to solve the drawbacks in the prior art.

SUMMARY OF THE INVENTION

In view of the above, the present disclosure provides an improved surface-treated copper foil and copper-clad laminate, which solves the drawbacks existing in the prior art.

According to one embodiment of the present disclosure, a surface-treated copper foil is provided and includes a treating surface, and a peak extreme height (Sxp) of the treating surface is in a range of 0.4 to 2.5 μm, where the hysteresis loop of the surface-treated copper foil includes a first magnetization and a second magnetization when the magnetic field strength of the hysteresis loop is zero, and the absolute difference between the value of the first magnetization and the value of the second magnetization is 20-1200 emu/m$^3$.

According to another embodiment of the present disclosure, a copper-clad laminate is provided. The copper-clad laminate includes a board and the abovementioned surface-treated copper foil, where the treating surface of the surface-treated copper foil is attached to the board.

According to one embodiment of the present disclosure, by controlling the peak extreme height (Sxp) of the treating surface to be in a range of 0.4 to 2.5 μm, and by controlling the absolute difference between the value of the first magnetization and the value of the second magnetization in a specific interval, for example, in a range of 20 to 1200 emu/m$^3$ when the magnetic field strength of the hysteresis loop is zero, the transmission loss of signal and adhesion strength of the copper-clad laminate may be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The disclosure will be better understood from the following description of exemplary embodiments together with reference to the accompanying drawings. The specific embodiments of the present disclosure and their working principle would be elaborated in detail by referring to the specific embodiments and the corresponding drawings of the present disclosure. In addition, the features in the drawings may not be drawn to scale for the sake of clarity, therefore the size of some of the features in the drawings may be deliberately enlarged or reduced.

DETAILED DESCRIPTION

Figure 1:
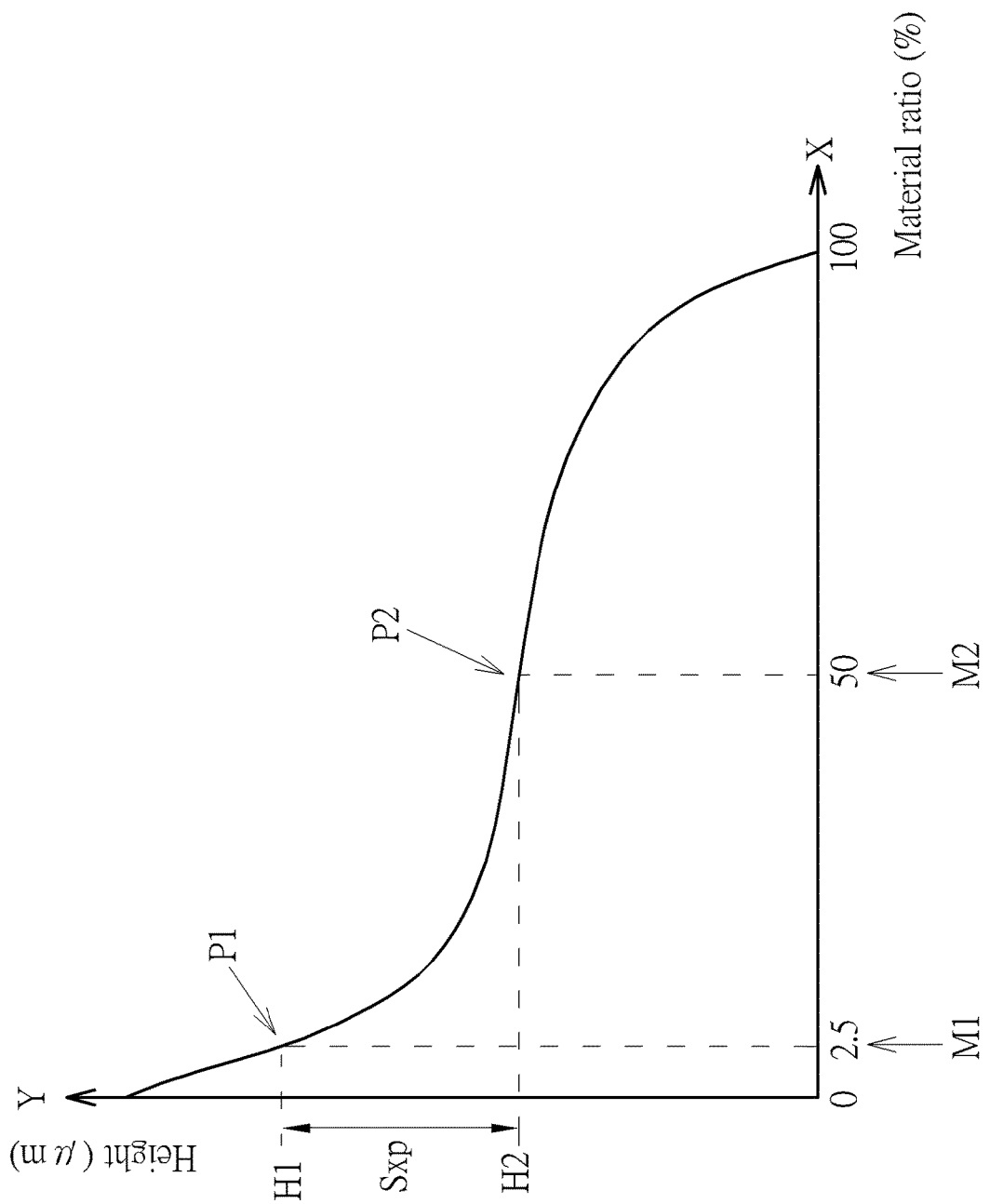
FIG. 1 is a plot showing the relationship between a peak extreme height (Sxp) and a material ratio (mr) of the surface-treated copper foil according to one embodiment of the present disclosure.

To provide a better understanding of the present disclosure to those of ordinary skill in the art, several exemplary embodiments of the present disclosure regarding surface-treated copper foils and copper clad laminates will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but may also include the meaning it is "above" or "over" something with no intermediate feature or layer therebetween (i.e., directly on something).

Although the present disclosure uses the first, second, third, etc. terms to describe various elements, components, regions, layers, and/or blocks, it should be understood that these elements, components, regions, layers, and/or blocks should not be limited by these terms. These words are only used to distinguish one element, part, region, layer and/or block from another, and they do not imply and represent any previous ordinal number of the element, nor the arrangement order of one element and another, or the order of manufacturing methods. Therefore, the first element, component, region, layer or block discussed below may also be referred to as the second element, component, region, layer or block without departing from the scope of embodiments of the present disclosure.

At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit and the scope of the present disclosure.

The surface-treated copper foil disclosed in the present disclosure includes a treating surface. A bulk copper foil of the surface-treated copper foil may be formed by an electrodeposition (or electrolysis, electrolytic deposition, electroplating), where the bulk copper foil may have a drum side and a deposited side opposite to the drum side.

Optionally, a surface treatment layer may be disposed on at least one of the drum side and the deposited side of the bulk copper foil. The surface treatment layer may be a single layer structure or a multi-layer stacked structure. For example, the surface treatment layer may be a multi-layer stacked structure including a plurality of sub-layers, and each of the surface treatment layers may be respectively disposed on the drum side and the deposited side of the bulk copper foil, but is not limited thereto. The sub-layers of each of the surface treatment layers may be selected from, but not limited to, the group consisting of a roughening layer, a barrier layer, an antirust layer and a coupling layer.

According to one embodiment of the present disclosure, a surface-treated copper foil is provided, which may be attached to a board to form a copper-clad laminate. According to one embodiment of the present disclosure, since the treating surface of the surface-treated copper foil is attached to the board in the subsequent process, a peak extreme height (Sxp) of the treating surface may have an influence on the adhesion strength between the surface-treated copper foil and the polymer board. According to one embodiment of the present disclosure, the peak extreme height (Sxp) of the treating surface may be 0.4-2.5 μm, for example, 0.4-2.2 μm, 0.4-2.0 μm, or 0.4-1.8 μm. In particular, the peak extreme height (Sxp) is according to the definition in ISO 25178-2: 2012, and the measurement result thereof may be shown in FIG. 1 as example.

FIG. 1 is a plot showing the relationship between the peak extreme height (Sxp) and the material ratio (mr) of the surface-treated copper foil according to one embodiment of the present disclosure. In particular, the peak extreme height (Sxp) is the absolute difference between a corresponding height H1 of a first data point P1 and a corresponding height H2 of a second data point P2. According to the definition in ISO 25178-2:2012, the corresponding material ratio M1 of the first data point P1 is 2.5%, while the corresponding material ratio M2 of the second data point P1 is 50%. Since the peak extreme height (Sxp) excludes high peaks with material ratio lower than 2.5%, the influence on roughness caused by a few high peaks may be eliminated. When the value of the peak extreme height (Sxp) is higher, it is beneficial to increase the adhesion strength (for example, the normal peel strength or peel strength after infrared heating reflow can be increased) between the surface-treated copper foil and the board, but when the value of the peak extreme height (Sxp) is too high, the degree of signal loss may be intensified.

In addition, some layers of the surface-treated copper foil according to embodiments of the present disclosure may be formed by an electrodeposition. For example, a bulk copper foil, a roughening layer, a barrier layer, and/or an antirust layer may be formed by the electrodeposition. During the electrodeposition process, the electrolyte solution may include not only copper ions but also a trace amount of ferromagnetic metal ions, such as iron ions, nickel ions, cobalt ions, or other metal ions. These metal ions may come from salts which are used as additives. The salts may be used to adjust the surface characteristics or the roughness of each electrodeposited layer, or to adjust the crystallinity or the mechanical strength of each electrodeposited layer, but not limited thereto. Therefore, when the bulk copper foil and some layers (such as the roughening layer, the barrier layer and/or the antirust layer) of the surface treatment layer are formed by the electrodeposition, a trace amount of the ferromagnetic metals may be contained in these layers. Because the magnetic susceptibility of the ferromagnetic metal is $10^1$-$10^6$, and a remanence may be generated under the influence of an external magnetic field, the transmission loss of signal may be more severe when the high-frequency signal is transmitted by the conductive lines fabricated from the aforementioned surface-treated copper foil.

In detail, for a hysteresis loop generated in response to the external magnetic field applying on the surface-treated copper foil, when the external magnetic field is zero, the corresponding magnetizations in the hysteresis loop may be a first magnetization and a second magnetization, respectively. According to one embodiment of the present disclosure, the value of the first magnetization in the hysteresis loop is greater than the value of the second magnetization, and the values of the first magnetization and the second magnetization may both be positive, or the value of the first magnetization is positive while the value of the second magnetization is negative. According to one embodiment of the present disclosure, for the hysteresis loop that achieves magnetic saturation (i.e. saturated hysteresis loop), the absolute difference between the value of the first magnetization and the value of the second magnetization is 20-1200 emu/m$^3$, for example, 20-1000 emu/m$^3$, 20-800 emu/m$^3$, 20-600 emu/m$^3$ or 20-500 emu/m$^3$.

According to one embodiment of the present disclosure, when the peak extreme height (Sxp) of the treating surface is in a range of 0.4 to 2.5 μm, and the absolute difference between the value of the first magnetization and the value of the second magnetization is 20-1200 emu/m$^3$, for the corresponding copper-clad laminate and a printed circuit board, the surface-treated copper foil and the polymer board in contact with the surface-treated copper foil may meet the requirements of relatively low transmission loss of signal, relatively high normal peel strength and relatively high peel strength after infrared heating reflow concurrently.

According to one embodiment of the present disclosure, when the peak extreme height (Sxp) of the treating surface is further controlled to be in a range of 0.4 to 1.8 μm, and when the absolute difference between the value of the first magnetization and the value of the second magnetization is 20-800 emu/m$^3$, the degree of transmission loss of signal may be further reduced.

According to one embodiment of the present disclosure, when the peak extreme height (Sxp) of the treating surface is in a range of 0.4 to 2.5 μm, and the absolute difference between the value of the first magnetization and the value of the second magnetization is further controlled to be 20-500 emu/m³, the degree of transmission loss of signal may also be further reduced.

In addition, in the case that an outermost surface of the surface treatment layer is the treating surface of the surface-treated copper foil, the silicon content of the surface treatment layer may also affect the normal peel strength and peel strength after infrared heating reflow. According to embodiments of the present disclosure, when an X-ray photoelectron spectroscopy (XPS) analysis is performed on the treating surface by using Ni, Cu, Zn, Co, Cr, Si, C, N, O, P and S as target atoms, the concentration of Si in the surface treatment layer may be controlled in a range of 2 to 15 atomic %, for example, in a range of 2.5 to 11.5 atomic % or in a range of 2.5 to 8.0 atomic %, based on the total number of the target atoms.

According to one embodiment of the present disclosure, when the peak extreme height (Sxp) of the treating surface is in a range of 0.4 to 2.5 µm, the absolute difference between the value of the first magnetization and the value of the second magnetization is 20-1200 emu/m³, and the concentration of Si in the surface treatment layer is further controlled to be in a range of 2 to 15 atomic %, for the corresponding copper-clad laminate and the printed circuit board, the peel strength after infrared heating reflow may be maintained at a certain level, and blistering, cracking and/or delamination for the copper-clad laminate and the printed circuit board may be avoided in the peel strength test after being treated with the infrared heating reflow. In addition, when the concentration of Si in the surface treatment layer is controlled to be in a range of 2.5 to 11.5 atomic %, or in a range of 2.5 to 8 atomic %, the peel strength after infrared heating reflow may be further maintained (namely, a relatively high maintenance rate for the peel strength).

Figure 2:
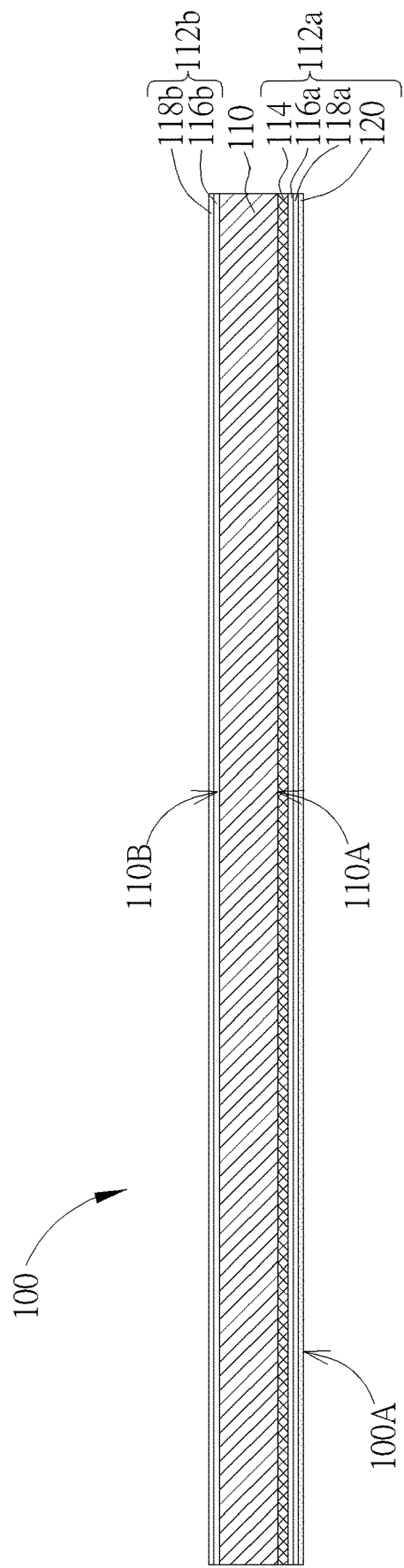
FIG. 2 is a schematic cross-sectional diagram of a surface-treated copper foil according to one embodiment of the present disclosure.

For the aforementioned surface-treated copper foil, the structure thereof may be shown as FIG. 2 as example. FIG. 2 is a schematic cross-sectional view of a surface-treated copper foil according to one embodiment of the present disclosure. As shown in FIG. 2, the thickness of the surface-treated copper foil 100 is usually greater than or equal to 6 µm, for example, in a range of 7 and 250 µm, or in a range of 9 and 210 µm, or in a range therebetween, for example, 12 µm, 18 µm, 35 µm, 70 µm, 105 µm, 140 µm, 175 µm and 210 µm. The aforementioned thickness adopts the weight average thickness, namely, the weight average thickness is obtained by dividing the weight per unit area (g/m²) of the surface-treated copper foil by the copper foil density (g/m³). In particular, the copper foil density may adopt the theoretical copper density of 8.96(g/cm³) when the surface treatment layer of the surface-treated copper foil is extremely thin. The surface-treated copper foil 100 includes a treating surface 100A, and the surface-treated copper foil 100 includes at least a bulk copper foil 110. The copper content in the bulk copper foil 110 is greater than or equal to 99%. One of the deposited side and the drum side of the bulk copper foil 110 corresponds to a first surface 110A, while the other one corresponds to a second surface 110B. According to one embodiment of the present disclosure, the deposited side corresponds to the first surface 110A, and the drum side corresponds to the second surface 110B. According to one embodiment of the present disclosure, although the bulk copper foil 110 is mainly composed of copper, it still contains a trace amount of the ferromagnetic metals, such as iron, nickel and cobalt, and the magnetization of the hysteresis loop of the surface-treated copper foil is thereby affected by these ferromagnetic metals.

The surface-treated copper foil 100 includes not only the bulk copper foil 110 but also an optional surface treatment layer, such as a first surface treatment layer 112a and a second surface treatment layer 112b, which are disposed on the first surface 110A and the second surface 110B, respectively. The outermost surface of the first surface treatment layer 112a may be regarded as the treating surface 100A of the surface-treated copper foil 100, and the treating surface 100A is in contact with a board during the subsequent process of laminating the surface-treated copper foil 100 to the board.

Each of the first surface treatment layer 112a and the second surface treatment layer 112b may be a single layer structure or a multi-layered stacked structure. In the case that the first surface treatment layer 112a is the multi-layered stacked structure including a plurality of sub-layers, each sub-layer may be selected from the group consisting of a roughening layer 114, a first barrier layer 116a, a first antirust layer 118a and a coupling layer 120. In the case that the second surface treatment layer 112b is a multi-layered stacked structure including a plurality of sub-layers, each sub-layer may be selected from the group consisting of a second barrier layer 116b and a second antirust layer 118b. The compositions of the first barrier layer 116a and the second barrier layer 116b may be the same or different from each other, and the compositions of the first antirust layer 118a and the second antirust layer 118b may be the same or different from each other.

The aforementioned roughening layer 114 includes nodules. The nodules may be used to improve the surface roughness of the bulk copper foil 110, which may be copper nodules or copper alloy nodules. In order to prevent the nodules from peeling off from the bulk copper foil 110, the roughening layer 114 may further include a covering layer disposed on the nodules to cover the nodules. The peak extreme height (Sxp) of the surface-treated copper foil 100 may be adjusted by adjusting the number and the size of the nodules in the roughening layer 114. For example, for the nodules and the covering layer formed by electrodeposition, the number and the size of the nodules may be adjusted by adjusting the types or the concentration of additives in the electrolyte solution and/or current density, but not limited thereto.

According to one embodiment of the present disclosure, the barrier layer may include the ferromagnetic metals, such as nickel, thus affecting the magnetization of the hysteresis loop of the surface-treated copper foil. The barrier layer may be, for example, a metal layer or a metal alloy layer. The metal layer may be selected from but not limited to nickel, zinc, chromium, cobalt, molybdenum, iron, tin, vanadium, tungsten and titanium. In addition, the metal layer and the metal alloy layer may be a single-layer structure or a multi-layer structure, such as zinc-containing single layer and nickel-containing single layer stacked on each other.

The antirust layer is a coating layer applied to the metal and may be used to protect the metal from deterioration caused by corrosion and the like. The antirust layer contains metal or organic compound. When the antirust layer includes metal, the metal may be chromium or chromium alloy, and the chromium alloy may further include one element selected from nickel, zinc, cobalt, molybdenum, vanadium and the combination thereof. When the antirust layer includes organic compounds, non-limiting examples of organic molecules that may be used to form the organic antirust layer include porphyrin group, benzotriazole, triazine trithiol and the combinations thereof. The porphyrin group includes porphyrin, porphyrin macrocycle, enlarged porphyrin, contracted porphyrin, linear porphyrin polymer, porphyrin sandwich coordination complex, porphyrin array, 5,10,15,20-tetrakis-(4-aminophenyl)-porphyrin-Zn(II) and/or combinations thereof.

The coupling layer may be made of silane. According to one embodiment of the present disclosure, the silicon concentration in the first surface treatment layer 112a is mainly contributed by the coupling layer 120. The coupling layer 120 constituted of silane may be formed by a spraying process. During the process of forming the coupling layer 120, the alkoxy groups in the silane may be hydrolyzed into hydroxyl groups, and the alkoxy groups may not only bond with the attached metal layer, but also polycondense with hydroxyl groups in the adjacent silane molecules, thus changing the adhesion strength between the silane and the metal layer. In addition, silane may also include amino groups, epoxy groups and/or alkylene groups, and these functional groups may thereby bond with the polymer in the board in the subsequent process of attaching the surface-treated copper foil to the board, thus improving the adhesion strength between the surface-treated copper foil and the board.

According to one embodiment of the present disclosure, the silicon concentration in the coupling layer 120 is not only related to the total organic carbon (TOC) content of the adjacent antirust layer 118a, but also related to the surface morphology or composition of the first barrier layer 116a and/or the bulk copper foil 110. Without being limited to any theory, it is speculated that the amount of silane adsorbed on the antirust layer 118a during the process of forming the coupling layer 120 may be affected, as the variation in the total organic carbon content and the variation in the surface morphology and the composition of the attached layer, which further affects the silicon concentration in the coupling layer 120.

The aforementioned silane may be selected from but not limited to 3-aminopropyltriethoxysilane, N-2-(aminoethyl)-3-aminopropyltrimethoxysilane, glycidoxypropyltriethoxysilane, 8-glycidoxypropyltriethoxysilane, 3-methacryloxypropyltriethoxysilane and 8-methacryloxyoctyl, 3-mercaptopropyltrimethoxysilane, 3-glycidylpropyltrimethoxysilane, 3-(methacryloxy)propyltrimethoxysilane, or vinyltriethoxysilane, which are used to improve the adhesion strength between the surface-treated copper foil and other materials (such as the board).

The aforementioned surface-treated copper foil 100 may be further processed to fabricate a copper-clad laminate (CCL). The copper-clad laminate includes at least the board and the surface-treated copper foil, and the surface-treated copper foil is disposed on at least one surface of the board. In particular, the treating surface of the surface-treated copper foil may be in direct contact with and facing the board.

The board may be made of bakelite board, polymer board or fiberglass board, but is not limited thereto. The polymer components of the polymer board may be such as epoxy resins, phenolic resins, polyester resins, polyimide resins, acrylics, formaldehyde resins, bismaleimidetriazine resins (also known as BT resin), cyanate ester resin, fluorinated fluoropolymers, poly ether sulfone, cellulosic thermoplastics, polycarbonate, polyolefins, polypropylene, polysulfide, polyurethane, polyimide, liquid crystal polymer (LCP), and polyphenyleneoxide (PPO). The aforementioned glass fiber board may be a prepreg formed by soaking glass fiber nonwoven fabric in the aforementioned polymer (e.g., epoxy resin).

The copper-clad laminate may be further processed to fabricate a printed circuit board, and the steps may include patterning the surface-treated copper foil to fabricate conductive lines, and bonding two adjacent boards to each other.

Methods for fabricating a surface-treated copper foil and a copper-clad laminate are further described as examples. Each step in the fabricating method is described as follows:

(1) Step A

In step A, an electrolyte solution to be used in electrodeposition process is pretreated by using a filtration procedure or an ion-exchange technology to remove ferromagnetic metal ions in the electrolyte solution or reduce the ratio between the ferromagnetic metal ions and other metal ions in the electrolyte solution. For example, by using ion-exchange technology, the electrolyte solution flows through a column filled with ion-exchange polymer, and thus the ferromagnetic metal ions, such as iron ion, nickel ion and cobalt ion in the electrolyte solution are replaced by non-ferromagnetic metal ions, such as sodium ion and potassium ion, or replaced by hydrogen ion. In particular, the ion-exchange polymer may be a chelate resin (manufactured by Purolite Corporation), and the flow rate of the electrolyte solution is in a range of 2 to 7 volume flow/resin volume (BV/min). The electrolyte solution may be treated by the ion-exchange resin for a single time or multiple times, and thus the concentration of the ferromagnetic metal ions, such as iron ion, nickel ion and cobalt ion in the electrolyte solution may reach a predetermined level.

(2) Step B

In step B, the pretreated electrolyte solution is used for electrodeposition to form the bulk copper foil. For example, an electrodeposition apparatus may be used to form the bulk copper foil (or referred to as a bulk copper foil) by an electrodeposition process. The electrodeposition apparatus may include at least a drum as a cathode, pairs of insoluble metal anode plates, and an inlet manifold for electrolyte solution. In particular, the drum is a rotatable metal drum, the surface thereof is a mirror polished surface. The metal anode plates may be separated from and fixedly disposed at the lower half of the drum to surround the lower half of the drum. The inlet manifold may be fixedly disposed under the drum and between two metal anode plates.

During the electrodeposition process, the inlet manifold continuously supplies electrolyte solution between the drum and the metal anode plates. By applying current or voltage between the drum and the metal anode plates, copper may be electrodeposited on the drum to form a bulk copper foil. In addition, the continuous bulk copper foil may be manufactured by continuously rotating the drum and peeling the bulk copper foil from the drum. In particular, the surface of the bulk copper foil facing the drum may be referred to as a drum side, while the surface of the electrodeposited copper foil away from the drum may be referred to as a deposited side.

For the bulk copper foil, the fabrication parameters are described as follows:

<1.1 Composition of Electrolyte Solution and Electrolysis Conditions for Bulk Copper Foil>

Copper sulfate ($CuSO_4 \cdot 5H_2O$): 320 g/L

Sulfuric acid: 95 g/L

Chloride ion (from hydrochloric acid, manufactured by RCl Labscan Ltd.): 30 mg/L (ppm)

Gelatin (DV, manufactured by Nippi, Inc.): 0.35 mg/L (ppm)

Ferromagnetic metal ions (iron ion, nickel ion and cobalt ion): 503-4011 ppm

Liquid temperature: 30-65° C.

Current density: 40-80 A/dm$^2$
Thickness of bulk copper foil: ~33 μm
(3) Step C
In step C, a surface cleaning process is performed on the bulk copper foil to ensure that the surface of the bulk copper foil is free of contaminant (such as oil stains and oxides), the fabrication parameters are described as follows:
<3.1 Composition and Cleaning Conditions of Cleaning Solution>
Copper sulfate (CuSO$_4$.5H$_2$O): 200 g/L
Sulfuric acid: 100 g/L
Liquid temperature: 25° C.
Soaking time: 5 seconds
(4) Step D
In step D, a roughening layer is formed on any side of the aforementioned bulk copper foil. For example, the nodules may be formed on the drum side of the bulk copper foil by an electrodeposition process. In addition, in order to prevent the nodules from falling, a covering layer may be further formed on the nodules. The fabrication parameters of the roughening layer (including the nodules and the covering layer) are as follows:
<4.1 Parameters for Fabricating Nodules>
Copper sulfate (CuSO$_4$.5H$_2$O): 150 g/L
Sulfuric acid: 100 g/L
Liquid temperature: 25° C.
Current density: 40 A/dm$^2$
Processing time: 10 seconds
<4.2 Parameters for Fabricating Covering Layer>
Copper sulfate (CuSO$_4$.5H$_2$O): 220 g/L
Sulfuric acid: 100 g/L
Liquid temperature: 40° C.
Current density: 15 A/dm$^2$
Processing time: 10 seconds
(5) Step E
In step E, a barrier layer is formed on each side of the bulk copper foil, for example, by an electrodeposition process, a barrier layer with a double-layer stacked structure (e.g., nickel-containing layer/zinc-containing layer, but not limited thereto) is formed on the side of the bulk copper foil having the roughening layer, while a barrier layer with a single-layer structure (e.g., zinc-containing layer, but not limited thereto) is formed on the side of the bulk copper foil without the roughening layer. The fabrication parameters thereof are described as follows:
<5.1 Electrolyte Composition and Electrodeposition Conditions for Forming Nickel-Containing Layer>
Nickel sulfate (NiSO$_4$.7H$_2$O): 180 g/L
Boric acid (H$_3$BO$_3$): 30 g/L
Sodium hypophosphite (NaH$_2$PO$_2$): 3.6 g/L
pH: 3.5
Liquid temperature: 20° C.
Current density: 0.2-0.5 A/dm$^2$
Processing time: 10 seconds
<5.2 Electrolyte Composition and Electrodeposition Conditions for Forming Zinc-Containing Layer>
Zinc sulfate (ZnSO$_4$.7H$_2$O): 9 g/L
pH: 13
Liquid temperature: 20° C.
Current density: 0.2 A/dm$^2$
Processing time: 10 seconds
(6) Step F
In step F, an antirust layer, such as a chromium-containing layer, is formed on the barrier layer on each side of the aforementioned bulk copper foil, and the fabrication parameters are described as follows:

<5.1 Electrolyte Composition and Electrodeposition Conditions for Forming Chromium-Containing Layer>
Chromium trioxide (CrO$_3$): 5 g/L
Total organic carbon (TOC) content: 105-1022 ppm
Liquid temperature: 30° C.
Current density: 5 A/dm$^2$
Processing time: 10 seconds
(7) Step G
In step G, a coupling layer is formed on the side of the bulk copper foil having the nodules, the covering layer, the barrier layer and the antirust layer. For example, after the completion of the aforementioned electrodeposition process, the bulk copper foil is cleaned by water, and the surface of the bulk copper foil is not subject to a drying process. Afterwards, an aqueous solution containing silane coupling agent is sprayed on the antirust layer on the side of the bulk copper foil having the nodules, and thus the silane coupling agent is adsorbed on the surface of the antirust layer. Subsequently, the bulk copper foil after the above treatment may be dried in an oven. The fabrication parameters are described as follows:
<7.1 Parameters for Fabricating a Silane Coupling Agent>
Silane coupling agent (may include single or multiple silicone compounds): 3-glycidoxypropyltrimethoxysilane (KBM-403), 3-aminopropyltriethoxysilane (S-330), 3-methacryloxypropyl trimethoxysilane (KBM-503), 3-acryloxyporopyl trimethoxysilane (KBM-5130), or vinyltrimethoxysilane (KBM-1003) Concentration of the silane coupling agent in aqueous solution: 0.25 wt. % Spraying time: 10 seconds In order to enable a person having ordinary skill in the art to implement the present disclosure, the specific examples regarding a copper foil and a copper-clad laminate are further elaborated below. It should be noted, however, that the following examples are for illustrative purposes only and should not be construed to limit the present disclosure. That is, the materials, the amounts and ratios of the materials, and the processing flow in the respective examples may be appropriately modified so long as these modifications are within the scope of the present disclosure as defined by the appended claims.

EXAMPLES

Examples 1-9

Examples 1-9 are surface-treated copper foils, and the fabricating process includes steps A to G in the aforementioned fabricating processes. The fabrication parameters that differ from those of the aforementioned fabricating process are shown in TABLE 1. Specifically, the structures of the surface-treated copper foils of Examples 1-9 are shown in FIG. 2, where the roughening layer is disposed on the drum side, and a nickel-containing layer, a zinc-containing layer, a chromium-containing layer and a coupling layer are sequentially formed on the roughening layer. A zinc-containing layer and a chromium-containing layer are sequentially formed on the side of the bulk copper foil without the roughening layer. The thickness of surface-treated copper foil is 35 μm.

Comparative Examples 1-9

The fabricating processes of Comparative Examples 1-9 correspond to steps A to G in the aforementioned fabricating processes. The fabrication parameters that differ from those of the aforementioned fabricating process are shown in TABLE 1. Specifically, the structures of the surface-treated copper foils of Comparative Examples 1-9 are shown in FIG. 2, where the roughening layer is disposed on the drum side, and a nickel-containing layer, a zinc-containing layer, a chromium-containing layer and a coupling layer are sequentially formed on the roughening layer. A zinc-containing layer and a chromium-containing layer are sequentially formed on the side of the bulk copper foil without the roughening layer. The thickness of surface-treated copper foil is 35 µm.

TABLE 1

| | Electrodeposited bulk copper foil | | Electrodeposited nickel-containing layer | Electrodeposited chromium-containing layer |
|---|---|---|---|---|
| | Concentration of iron ion, nickel ion and cobalt ion (ppm) | Current density (A/dm$^2$) | Current density (A/dm$^2$) | Total organic carbon (ppm) |
| Ex. 1 | 518 | 45 | 0.2 | 108 |
| Ex. 2 | 2010 | 45 | 0.2 | 105 |
| Ex. 3 | 4006 | 45 | 0.2 | 112 |
| Ex. 4 | 3981 | 45 | 0.2 | 607 |
| Ex. 5 | 521 | 45 | 0.2 | 1010 |
| Ex. 6 | 503 | 75 | 0.2 | 1004 |
| Ex. 7 | 4011 | 75 | 0.5 | 107 |
| Ex. 8 | 509 | 75 | 0.35 | 1019 |
| Ex. 9 | 518 | 45 | 0.5 | 1022 |
| c.f. 1 | 4253 | 45 | 0.2 | 104 |
| c.f. 2 | 4504 | 60 | 0.2 | 108 |
| c.f. 3 | 250 | 45 | 0.2 | 114 |
| c.f. 4 | 509 | 80 | 0.2 | 1020 |
| c.f. 5 | 519 | 40 | 0.2 | 1020 |
| c.f. 6 | 505 | 75 | 0.6 | 1013 |
| c.f. 7 | 513 | 75 | 0.1 | 1015 |
| c.f. 8 | 515 | 45 | 0.2 | 51 |
| c.f. 9 | 517 | 45 | 0.2 | 1059 |

The test results of the aforementioned Examples 1-9 and Comparative Examples 1-9, such as <Magnetization>, <Peak extreme height (Sxp)>, <Silicon concentration>, <Transmission loss of signal>, <Normal peel strength>, <Peel strength after infrared heating reflow>, and <Maintenance rate for peel strength> are further elaborated below. The test results are shown in TABLEs 2 and 3.

<Magnetization>

By using a superconducting quantum interference device (SQUID), the surface-treated copper foil cut to 5 mm×5 mm is applied with a gradually-varied external magnetic field and the hysteresis loop of the surface-treated copper foil is measured accordingly. In particular, when the external magnetic field is zero, the corresponding magnetizations in the hysteresis loop may be the first magnetization and the second magnetization respectively, and the magnetization difference is defined as the absolute difference between the value of the first magnetization and the value of the second magnetization divided by the sample volume. In particular, the direction of the vector of the external magnetic field is perpendicular to the thickness direction of the surface-treated copper foil. Specific measurement conditions are as follows, and the test results are shown in TABLEs 2 and 3:
Instrument: MPMS 3
External magnetic field strength: 0-10 kOe
Scanning method of external magnetic field: 0 kOe→10 kOe→−10 kOe→10 kOe
Scan interval: 1 kOe
Air temperature: 25±3° C.
Sample area: 5 mm×5 mm
Sample thickness: dividing weight per unit area (g/m$^2$) of surface-treated copper foil by density of bulk copper foil (g/m$^3$)

<Peak Extreme Height (Sxp)>

Peak extreme height (Sxp) of the treating surface of the surface-treated copper foil is defined in accordance with ISO 25178-2: 2012 by using surface texture analysis of a laser microscope (LEXT OLS5000-SAF, manufactured by Olympus). Specific measurement conditions are as follows, and the test results are shown in TABLEs 2 and 3:
Wavelength of light source: 405 nm
Objective lens magnification: 100× objective lens (MPLAPON-100× LEXT, manufactured by Olympus)
Optical zoom: 1.0×
Image area: 129 µm×129 µm
Resolution: 1024 pixels×1024 pixels
Mode: the Auto tilt removal
Filter: unfiltered <Silicon Concentration>

The treating surface of the surface-treated copper foil, such as the surface treatment layer at the side of the treating surface, is measured by an X-ray photoelectron spectroscopy (XPS) to measure the silicon concentration (atomic %) in the surface treatment layer. Specific measurement conditions are as follows, and the test results are shown in TABLE 3:
Instrument: VG ESCALAB 250, Thermo Fisher
Anode target: Aluminum
X-ray source: monochromatic Al K$_\alpha$ (1486.9 eV)
Beam size: 650 µm
Measuring depth: 5-10 nm
Target elements: Ni, Cu, Zn, Co, Cr, Si, C, N, O, P, S
Detection conditions: (1) pass energy=100 eV; (2) step=1 eV; (3) rate=50 ms <Transmission Loss of Signal>

Figure 3:
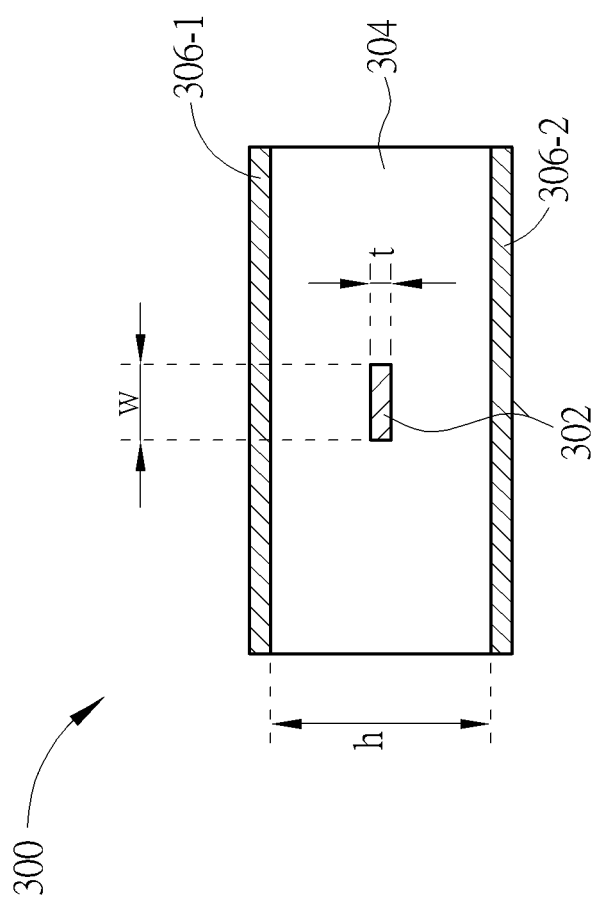
FIG. 3 is a schematic diagram of a strip-line according to one embodiment of the present disclosure.

The surface-treated copper foil of any of the aforementioned embodiments is made into a strip-line as shown in FIG. 3, and the corresponding transmission loss of signal is measured. Specifically, for a strip-line 400, the surface-treated copper foil of any of the aforementioned embodiments is attached to the commercial resin (S7439G, manufactured by Shengyi Technology Co.) with a thickness of 152.4 µm, subsequently the surface-treated copper foil is made into a conductive line 402, and then a plural pieces of the resins (S7439G, manufactured by Shengyi Technology Co.) are used to cover the two side surfaces respectively, so that the conductive line 402 is disposed in a dielectric body (S7439G, manufactured by Shengyi Technology Co.) 404. The strip-line 400 may further include two grounded electrodes 406-1 and 406-2 disposed on opposite sides of the dielectric body 404, respectively. The grounded electrode 406-1 and the grounded electrode 406-2 may be electrically connected to each other through the conductive via hole, so that the grounded electrode 406-1 and the grounded electrode 406-2 have equal electric potential. The specifications of each component in the strip-line 400 are as follows:
The length of the conductive line 402: 100 mm
The width w: 120 m
The thickness t: 35 µm
The dielectric characteristic of the dielectric body 404: Dk=3.74 and Df=0.006 (measured at 10 GHz signal according to IPC-TM 650 No. 2.5.5.5)
The characteristic impedance: 50Ω.
State: without covering film For the measurement of the transmission loss of signal, which is measured according to the standard Cisco S3 method, the signal analyzer is used to input the electrical signal from one end of the conductive line 402 when the grounded electrodes 406-1 and 406-2 are both at the ground potential, and measures the output value at the other end of the conductive line 402 to determine the transmission loss of signal caused by the strip-line 400. Specific measurement conditions are as follows:

Signal analyzer: PNA N5227B (Keysight Technologies)
Frequency of electrical signal: 10 MHz to 20 GHz
Sweeping points: 2000 points
Calibration mode: E-Cal (cal kit: N4692D)

The degree of transmission loss of signal of the corresponding strip-line is judged under the condition that the frequency of the electrical signal is set at 16 GHz. In particular, when the absolute value of transmission loss of signal is smaller, it means that the degree of signal loss is less. The criteria for the judgement are as follows:

A (the signal transmission performance is best): the absolute value of transmission loss of signal is less than 0.75 dB/in B (the signal transmission performance is good): the absolute value of transmission loss of signal is in a range of 0.75 to 0.80 dB/in C (the signal transmission performance is worst): the absolute value of transmission loss of signal is larger than 0.80 dB/in Normal Peel Strength>

The surface-treated copper foil and the resin (S7439G, manufactured by Shengyi Technology Co.) are laminated to form a copper-clad laminate in a way that the treating surface of the surface-treated copper foil faces the resin. The pressing conditions are as follows: temperature: 200° C., pressure: 100 psi, pressing time: 120 minutes.

Afterwards, a universal testing machine (AG-I, manufactured by Shimadzu Corp.) is used to peel the surface-treated copper foil from the copper-clad laminate at an angle of 90° in accordance with the standard IPC-TM-650 2.4.8. The measurement results are shown in TABLE 2.

<Peel Strength after Infrared Heating Reflow>

The surface-treated copper foil and the resin (S7439G, manufactured by Shengyi Technology Co.) are laminated to form a copper-clad laminate in a way that the treating surface of the surface-treated copper foil faces the resin. The pressing conditions are as follows: temperature: 200° C., pressure: 100 psi, pressing time: 120 minutes.

Afterwards, a heat treatment is performed on the copper-clad laminate in an infrared heating reflow oven. Conditions for the heat treatment are as follows: temperature: 260° C., duration for each reflow: 60 seconds, total reflow times: 10 times. The copper-clad laminate is cooled to room temperature on completion of each reflow process, and then the next reflow process is continued.

Afterwards, a universal testing machine (AG-I, manufactured by Shimadzu Corp.) is used to peel the surface-treated copper foil from the copper-clad laminate at an angle of 90° in accordance with the standard IPC-TM-650 2.4.8. The measurement results are shown in TABLEs 2 and 3.

<Maintenance Rate for Peel Strength>

According to the aforementioned <Normal peel strength> and <Peel strength after infrared heating reflow> of the surface-treated copper foil, the maintenance rate for peel strength is calculated by taking <Peel strength after infrared heating reflow> as a numerator and <Normal peel strength> as a denominator (namely, the value obtained by dividing <Peel strength after infrared heating reflow> by <Normal peel strength>). When the maintenance rate for peel strength is closer to 100%, it means that the adhesion strength of the corresponding surface-treated copper foil is better. The measurement results are shown in TABLE 3.

TABLE 2

| | Magnetic field strength difference (emu/m$^3$) | Sxp (μm) | Transmission loss of signal | Normal peel strength (lb/in) | Peel strength after infrared heating reflow (lb/in) |
|---|---|---|---|---|---|
| Ex. 1 | 32 | 0.43 | A | 4.53 | 4.05 |
| Ex. 2 | 433 | 1.15 | A | 4.78 | 4.41 |
| Ex. 3 | 761 | 2.06 | B | 5.24 | 5 |
| Ex. 4 | 757 | 1.94 | B | 5.53 | 5.12 |
| Ex. 5 | 28 | 0.49 | A | 5.04 | 4.15 |
| Ex. 6 | 25 | 1.72 | A | 5.54 | 4.74 |
| Ex. 7 | 1182 | 2.47 | B | 5.57 | 5.5 |
| Ex. 8 | 571 | 1.87 | B | 5.61 | 5.11 |
| Ex. 9 | 921 | 0.54 | B | 5.11 | 4.55 |
| c.f. 1 | 1321 | 2.23 | C | 5.28 | 5.14 |
| c.f. 2 | 1612 | 2.97 | C | 5.73 | 5.7 |
| c.f. 3 | 13 | 0.28 | A | 3.44 | 2.51 |
| c.f. 4 | 30 | 2.68 | C | 5.68 | 4.73 |
| c.f. 5 | 24 | 0.35 | A | 3.87 | 3.07 |
| c.f. 6 | 1416 | 1.68 | C | 5.47 | 4.92 |
| c.f. 7 | 5 | 1.63 | A | 5.38 | failed* |

*The copper-clad laminate is delaminated or cracked during the heat treatment in the infrared heating reflow oven.

For Examples 1-9 according to TABLE 2, when the peak extreme height (Sxp) of the treating surface is in a range of 0.4 to 2.5 μm, and the absolute difference between the value of the first magnetization and the value of the second magnetization (namely, the magnetic field strength difference) is 20-1200 emu/m$^3$, the corresponding transmission loss of signal at least achieves class B (the good class), the corresponding normal peel strength may be higher than or equal to 4.53 lb/in, and the corresponding peel strength after infrared heating reflow may be higher than or equal to 4.15 lb/in. In contrast, for Comparative Examples 1-7, when one of the peak extreme height (Sxp) or the magnetic field strength difference does not fall within the above range, even though the transmission loss of signal of specific Comparative Examples (for example, Comparative Examples 3, 5 and 7) still achieves class A (the best class), at least one of the corresponding normal peel strength and the corresponding peel strength after infrared heating reflow is inferior to any of Examples 1-9.

For Examples 1, 2, 5, 6 and 9, when the absolute difference between the value of the first magnetization and the value of the second magnetization (namely, the magnetic field strength difference) is 20-800 emu/m$^3$, and the peak extreme height (Sxp) of the treating surface is further controlled to be in a range of 0.4 to 1.8 μm, the degree of transmission loss of signal may be further reduced.

For Examples 1, 2, 5 and 6, when the peak extreme height (Sxp) of the treating surface is in a range of 0.4 to 2.5 μm, and the absolute difference between the value of the first magnetization and the value of the second magnetization (namely, the magnetic field strength differences) is further controlled to be 20-800 emu/m$^3$, the corresponding transmission loss of signal achieves the best class.

TABLE 3

| | Magnetic field strength difference (emu/m$^3$) | Sxp (pm) | Concentration of Si (at. %) | Normal peel strength (lb/in) | Peel strength after infrared reflow (lb/in) | Maintenance rate for peel strength (%) |
|---|---|---|---|---|---|---|
| Ex. 1 | 32 | 0.43 | 2.3 | 4.53 | 4.05 | 89 |
| Ex. 2 | 433 | 1.15 | 2.8 | 4.78 | 4.41 | 92 |
| Ex. 3 | 761 | 2.06 | 2.6 | 5.24 | 5 | 95 |

TABLE 3-continued

|  | Magnetic field strength difference (emu/m³) | Sxp (pm) | Concentration of Si (at. %) | Normal peel strength (lb/in) | Peel strength after infrared reflow (lb/in) | Maintenance rate for peel strength (%) |
| --- | --- | --- | --- | --- | --- | --- |
| Ex. 4 | 757 | 1.94 | 7.9 | 5.53 | 5.12 | 93 |
| Ex. 5 | 28 | 0.49 | 12.6 | 5.04 | 4.15 | 82 |
| Ex. 6 | 25 | 1.72 | 12 | 5.54 | 4.74 | 86 |
| Ex. 7 | 1182 | 2.47 | 4.1 | 5.57 | 5.5 | 99 |
| Ex. 8 | 571 | 1.87 | 13.5 | 5.61 | 5.11 | 91 |
| Ex. 9 | 921 | 0.54 | 14.5 | 5.11 | 4.55 | 89 |
| c.f. 3 | 13 | 0.28 | 2.5 | 3.44 | 2.51 | 73 |
| c.f. 5 | 24 | 0.35 | 12.3 | 3.87 | 3.07 | 79 |
| c.f. 8 | 5 | 1.63 | 1.6 | 3.75 | 3.31 | 88 |
| c.f. 9 | 5 | 1.63 | 16.8 | 5.23 | failed | — |

For Examples 1-9 according to TABLE 3, when the peak extreme height (Sxp) of the treating surface is in a range of 0.4 to 2.5 μm, and the absolute difference between the value of the first magnetization and the value of the second magnetization (namely, the magnetic field strength difference) is 20-1200 emu/m³, and the concentration of Si is further controlled to be in a range of 2 to 15 atomic %, the corresponding normal peel strength may be higher than or equal to 4.53 lb/in, and the corresponding peel strength after infrared heating reflow may be higher than or equal to 4.15 lb/in. In contrast, for Comparative Examples 3, 5, 8 and 9, when one of the peak extreme height (Sxp), the magnetic field strength difference, or the concentration of Si does not fall within the above range, at least one of the corresponding normal peel strength and the corresponding peel strength after infrared heating reflow may be inferior to any of Examples 1-9.

In addition, for Examples 1-4 and 7, when the concentration of Si is controlled to be in a range of 2.5 to 11.5 atomic %, or in a range of 2.5 to 8.0 atomic %, the maintenance rate for peel strength may be further increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A surface-treated copper foil, comprising a treating surface, and a peak extreme height (Sxp) of the treating surface being in a range of 0.4 to 2.5 μm, wherein a hysteresis loop of the surface-treated copper foil comprises a first magnetization and a second magnetization when the magnetic field strength of the hysteresis loop is zero, and the absolute difference between the value of the first magnetization and the value of the second magnetization is in a range of 20-1200 emu/m³.

2. The surface-treated copper foil of claim 1, wherein the peak extreme height (Sxp) of the treating surface is in a range of 0.4 to 1.8 μm, and the absolute difference between the value of the first magnetization and the value of the second magnetization is in a range of 20-800 emu/m³.

3. The surface-treated copper foil of claim 1, wherein the absolute difference between the value of the first magnetization and the value of the second magnetization is in a range of 20-500 emu/m³.

4. The surface-treated copper foil of claim 1, further comprising:
   a bulk copper foil; and
   a surface treatment layer, disposed on at least one surface of the bulk copper foil, wherein an outermost surface of the surface treatment layer is the treating surface.

5. The surface-treated copper foil of claim 4, wherein when an X-ray photoelectron spectroscopy (XPS) analysis is performed on the treating surface by using Ni, Cu, Zn, Co, Cr, Si, C, N, O, P and S as target atoms, the concentration of Si in the surface treatment layer is in a range of 2 to 15 atomic % based on the total number of the target atoms.

6. The surface-treated copper foil of claim 5, wherein the concentration of Si in the surface treatment layer is in a range of 2.5 to 11.5 atomic %.

7. The surface-treated copper foil of claim 5, wherein the concentration of Si in the surface treatment layer is in a range of 2.5 to 8.0 atomic %.

8. The surface-treated copper foil of claim 4, wherein the surface treatment layer comprises at least two sublayers, and one of the at least two sublayers is selected from the group consisting of a roughening layer, a barrier layer and an antirust layer.

9. The surface-treated copper foil of claim 8, wherein the other one of the at least two sublayers is a silicon-containing coupling layer.

10. The surface-treated copper foil of claim 8, wherein a composition of at least one of the roughening layer, the barrier layer and the antirust layer comprises a ferromagnetic metal.

11. The surface-treated copper foil of claim 10, wherein the ferromagnetic metal comprises nickel, cobalt or iron.

12. A copper-clad laminate, comprising:
   a board; and
   the surface-treated copper foil of claim 1, wherein the treating surface is attached to the board.

* * * * *